US009786533B2

(12) United States Patent
Kaneko (10) Patent No.: US 9,786,533 B2
(45) Date of Patent: Oct. 10, 2017

(54) SUBSTRATE PROCESSING APPARATUS, SUBSTRATE PROCESSING METHOD AND STORAGE MEDIUM

(75) Inventor: Tomohiro Kaneko, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 1070 days.

(21) Appl. No.: 13/564,217

(22) Filed: Aug. 1, 2012

(65) Prior Publication Data

US 2013/0032179 A1 Feb. 7, 2013

(30) Foreign Application Priority Data

Aug. 4, 2011 (JP) ................................. 2011-171135

(51) Int. Cl.
*H01L 21/677* (2006.01)
*H01L 21/67* (2006.01)

(52) U.S. Cl.
CPC .... *H01L 21/67745* (2013.01); *H01L 21/6715* (2013.01); *H01L 21/67276* (2013.01); *H01L 21/67766* (2013.01)

(58) Field of Classification Search
CPC ......... H01L 21/67778; H01L 21/67781; H01L 21/67276; H01L 21/67745
See application file for complete search history.

(56) References Cited

U.S. PATENT DOCUMENTS

| 5,975,740 A * | 11/1999 | Lin ........................ G06Q 10/06 414/936 |
| 2004/0043513 A1* | 3/2004 | Ishizawa .............. B65G 49/067 438/1 |
| 2004/0225393 A1* | 11/2004 | Kawano ........... G05B 19/41865 700/100 |
| 2006/0183408 A1* | 8/2006 | Yilmaz ............. H01L 21/67778 451/28 |

(Continued)

FOREIGN PATENT DOCUMENTS

| JP | 2009-260087 A | 11/2009 |
| JP | 2010-129769 A | 6/2010 |
| KR | 10-2001-0006812 A | 1/2001 |

*Primary Examiner* — Michael Kornakov
*Assistant Examiner* — Marc Lorenzi
(74) *Attorney, Agent, or Firm* — Abelman, Frayne & Schwab (57) ABSTRACT

Provided is a substrate processing apparatus which can efficiently transfer substrates using a conveying mechanism including a plurality of substrate holding members. The substrate processing apparatus transfers a processed substrate to an intermediate conveying unit using a transport mechanism when the processed substrate returns to a substrate receiving unit. When a conveying mechanism withdraws the processed substrate from the intermediate conveying unit and transfers the processed substrate to the substrate receiving unit, a control unit determines whether both of a first substrate processed first among a plurality of substrates withdrawn from the substrate receiving unit as a set and a succeeding substrate processed later than the first (Continued)

substrate should be transferred together after waiting until the succeeding substrate is transferred to the intermediate conveying unit or to transfer the first substrate without waiting for the succeeding substrate, when the first substrate is transferred to the intermediate conveying unit.

4 Claims, 9 Drawing Sheets

(56) References Cited

U.S. PATENT DOCUMENTS

| | | | |
|---|---|---|---|
| 2007/0142962 A1* | 6/2007 | Takizawa | H01L 21/67265 700/218 |
| 2010/0129182 A1* | 5/2010 | Ishida | H01L 21/67781 414/222.1 |
| 2010/0236718 A1* | 9/2010 | Wakabayashi | H01J 37/32743 156/345.31 |
| 2011/0135428 A1* | 6/2011 | Kim | H01L 21/67781 414/222.07 |

* cited by examiner

SUBSTRATE PROCESSING APPARATUS, SUBSTRATE PROCESSING METHOD AND STORAGE MEDIUM

CROSS-REFERENCE TO RELATED APPLICATIONS

This application is based on and claims priority from Japanese Patent Application No. 2011-171135, filed on Aug. 4, 2011, with the Japanese Patent Office, the disclosure of which is incorporated herein in its entirety by reference.

TECHNICAL FIELD

The present disclosure relates to a technology for transferring substrates between a substrate receiving unit receiving a plurality of substrates to be processed and a processing unit.

BACKGROUND

In a semiconductor device manufacturing process of forming a laminated structure for an integrated circuit on a surface of a semiconductor wafer (hereinafter, referred to as a wafer) serving as a substrate, a substrate processing apparatus is used for performing various processes such as a deposition process an etching process, and a coating and developing process of a resist film in a photolithography process on a wafer.

For example, Japanese Patent Application Laid-Open No. 2010-129769 (see, for example, claim 1, paragraphs [0042] to [0050], and FIG. 1) describes a substrate processing apparatus (a substrate processing system) in which a plurality of processing units (wafer processing units) are provided for supplying various processing liquids to a wafer to perform a liquid processing or a drying processing, and a wafer in a substrate receiving unit such as a front-opening unified pod (FOUP) is transported to each of the processing units using a transport mechanism (a second substrate transport device) or a conveying mechanism (a first substrate transport device).

In the substrate processing apparatus, a shelf-stage type intermediate conveying unit (a substrate accommodating unit) is provided for temporarily disposing a wafer being transferred between the FOUP and the processing units, transferring a wafer between the transport mechanism and the conveying mechanism, and accommodating a plurality of wafers. A wafer is exclusively transferred between the FOUP and the intermediate conveying unit by the conveying mechanism, and a wafer is transferred between the intermediate conveying unit and the processing units by the transport mechanism. The conveying mechanism sequentially transfers wafers to unoccupied units of the intermediate conveying unit to increase the transfer efficiency.

SUMMARY

A substrate processing apparatus according to the present disclosure includes: a disposition table where a substrate receiving unit configured to receive a plurality of substrates is disposed; a plurality of processing units configured to process a substrate withdrawn from the substrate receiving unit; an intermediate conveying unit where the substrates are disposed; a transport mechanism configured to transfer the substrates processed in each of the processing units to the intermediate conveying unit one by one; a conveying mechanism including a plurality of substrate holding members and configured to transfer the substrates between the substrate receiving unit and the intermediate conveying unit; and a control unit configured to determine whether a first substrate processed first and a succeeding substrate processed later than the first substrate among a plurality of substrates withdrawn from the substrate receiving unit as a set by the conveying mechanism are transferred together by the conveying mechanism when the succeeding substrate is transferred to the intermediate conveying unit, or only the first substrate is transferred by the conveying mechanism without waiting for the succeeding substrate, when the first substrate is transferred to the intermediate conveying unit.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

In the substrate processing apparatus described in Japanese Patent Application Laid-Open No. 2010-129769, two substrate holding members (forks) are provided in the conveying mechanism such that unprocessed wafers may be sequentially transferred from the FOUP to the intermediate conveying unit while taking two wafers as one set. When the processed wafers are transferred from the intermediate conveying unit to the FOUP, the conveying mechanism transfers the wafers after waiting until the same set of two processed wafers are provided in the intermediate conveying unit.

However, when a problem occurs in a processing unit or processing times for the wafers are different, a transfer efficiency of the wafers may not be high when two wafers are simultaneously transferred. In this regard, Japanese Patent Application Laid-Open No. 2010-129769 does not disclose a method of determining how wafers are transferred so as to realize an efficient transfer in this case.

The present disclosure has been made in an effort to provide a substrate processing apparatus which can efficiently transfer wafers using a conveying mechanism including a plurality of substrate holding members, a substrate processing method, and a computer-readable storage medium for storing a computer program that, when executed, causes a computer to perform the substrate processing method.

A substrate processing apparatus according to the present disclosure is provided, which includes: a disposition table where a substrate receiving unit configured to receive a plurality of substrates is disposed; a plurality of processing units configured to process a substrate withdrawn from the substrate receiving unit; an intermediate conveying unit where the substrates are disposed; a transport mechanism configured to transfer the substrates processed in each of the processing units to the intermediate conveying unit one by one; a conveying mechanism including a plurality of substrate holding members and configured to transfer the substrates between the substrate receiving unit and the intermediate conveying unit; and a control unit configured to determine whether a first substrate processed first and a succeeding substrate processed later than the first substrate among a plurality of substrates withdrawn from the substrate receiving unit as a set by the conveying mechanism are transferred together by the conveying mechanism when the succeeding substrate is transferred to the intermediate conveying unit, or only the first substrate is transferred by the conveying mechanism without waiting for the succeeding substrate, when the first substrate is transferred to the intermediate conveying unit.

The substrate processing apparatus described above may include the following characteristics.

(a) The determination performed by the control unit compares a standby time counted until the succeeding substrate is transferred to the intermediate conveying unit with a transport time counted until a next substrate is disposed in the intermediate conveying unit after the first substrate is transferred to the substrate receiving unit, and when the standby time is shorter than the transport time, the conveying mechanism waits until the succeeding substrate is transferred to the intermediate conveying unit.

(b) When a substrate processed earlier than the second substrate is present in one of the plurality of processing units, a time counted until a substrate carried into one of the plurality of processing units first is transferred to the intermediate conveying unit becomes the standby time, or a time counted until a substrate processed first is transferred to the intermediate conveying unit becomes the standby time.

(c) When a plurality of types of processing are executed in a predetermined sequence in the processing units, the determining determines whether a processing whose sequence is behind a predetermined timing among the plurality of processings is executed on the succeeding substrate, and when the processing whose sequence is behind the predetermined timing is executed, the conveying mechanism waits until the succeeding substrate is transferred to the intermediate conveying unit.

(d) The control unit operates a timer after the first substrate is transferred to the intermediate conveying unit, and when the succeeding substrate is not transferred to the intermediate conveying unit until the timer is timed up, the conveying mechanism transfers the first substrate.

(e) the processing units include a first group of upper processing units and a second group of lower processing units which are vertically stacked each other, the intermediate conveying unit includes a first intermediate conveying unit communicated with the first group of processing units and a second intermediate conveying unit communicated with the second group of processing units, and the conveying mechanism transfers a substrate between the first intermediate conveying unit and the second intermediate conveying unit, and transfers a substrate between the second intermediate conveying unit and the substrate receiving unit.

(f) Each of the processing units is a single-type liquid processing unit including a substrate holder which is rotatable and configured to hold a substrate horizontally, and a nozzle unit configured to supply a processing liquid to a rotating substrate.

(g) The succeeding substrate is a second substrate withdrawn together with the first substrate as a set.

(h) A substrate processing method according to another exemplary embodiment of the present disclosure is provided, for processing a plurality of substrates in a plurality of processing units, and returning the processed substrates to a substrate receiving unit, using a substrate processing apparatus. The substrate processing apparatus comprises: a disposition table where the substrate receiving unit configured to receive the substrates is disposed; the processing units configured to process a substrate withdrawn from the substrate receiving unit; an intermediate conveying unit where the substrates are disposed; a transport mechanism configured to transfer the substrates processed in each of the processing units to the intermediate conveying unit one by one; a conveying mechanism including a plurality of substrate holding members and configured to transfer the substrates between the substrate receiving unit and the intermediate conveying unit; and a control unit configured to control the disposition table, the processing units, the intermediate conveying unit, the transport mechanism and the conveying mechanism to perform the substrate processing method. The substrate processing method comprises: transferring substrates processed in the processing units to the intermediate conveying unit one by one; and determining whether a first substrate processed first and a succeeding substrate processed later than the first substrate among a plurality of substrates withdrawn from the substrate receiving unit as a set by the conveying mechanism are transferred together by the conveying mechanism when the succeeding substrate is transferred to the intermediate conveying unit, or only the first substrate is transferred by the conveying mechanism without waiting for the succeeding substrate processed later than the first substrate, when the first substrate is transferred to the intermediate conveying unit.

(i) The standby time is a time counted until a second substrate which is processed among a plurality of substrates withdrawn together with the first substrate as a set is transferred to the intermediate conveying unit.

(j) The substrate processing method further includes: performing a timing after the first substrate is transferred to the intermediate conveying unit. The determining determines whether the processed succeeding substrate is transferred to the conveying mechanism until a preset standby time elapses, and when the processed succeeding substrate is not transferred to the conveying mechanism, the conveying mechanism transfers the first substrate.

(k) A non-transitory computer-readable storage medium is provided, for storing a computer program that, when executed, causes a computer to perform the substrate processing method as described above.

The present disclosure can flexibly transfer substrates using a conveying mechanism for transferring processed substrates between an intermediate conveying unit where a plurality of substrates are disposed and a substrate receiving unit, thereby realizing an efficient transfer of substrates.

Hereinafter, a configuration of a liquid processing apparatus 1 which is an example of a substrate processing apparatus according to an exemplary embodiment of the present disclosure will be described. The liquid processing apparatus 1 according to the present exemplary embodiment includes, for example, eight liquid processing units 601 to 608 for supplying a processing liquid to a wafer W which is a substrate and performing a liquid processing, and four liquid processing units 601, 603, 605 and 607 for processing a surface of wafer W and remaining four liquid processing units 602, 604, 606 and 608 for processing a rear surface of the wafer W.

Figure 1:
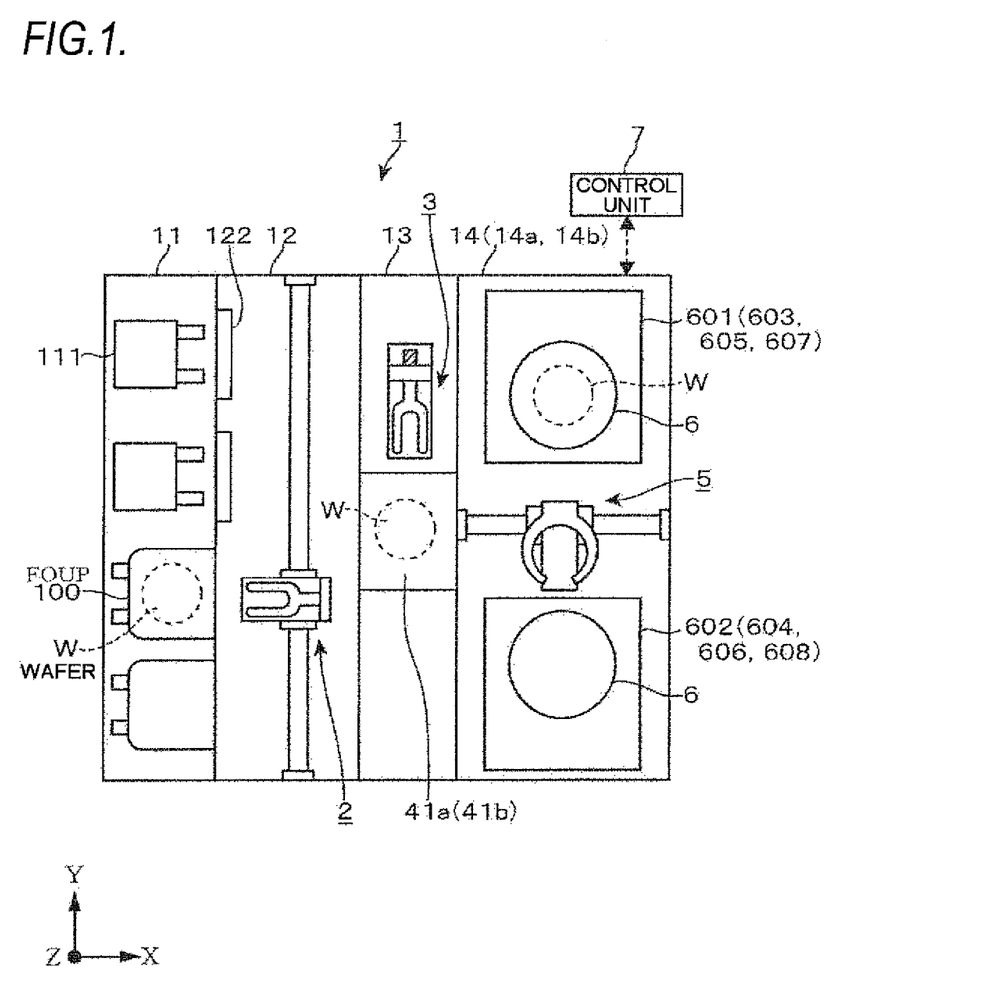
FIG. 1 is a transverse plan view of a liquid processing apparatus according to an exemplary embodiment of the present disclosure.
Figure 2:
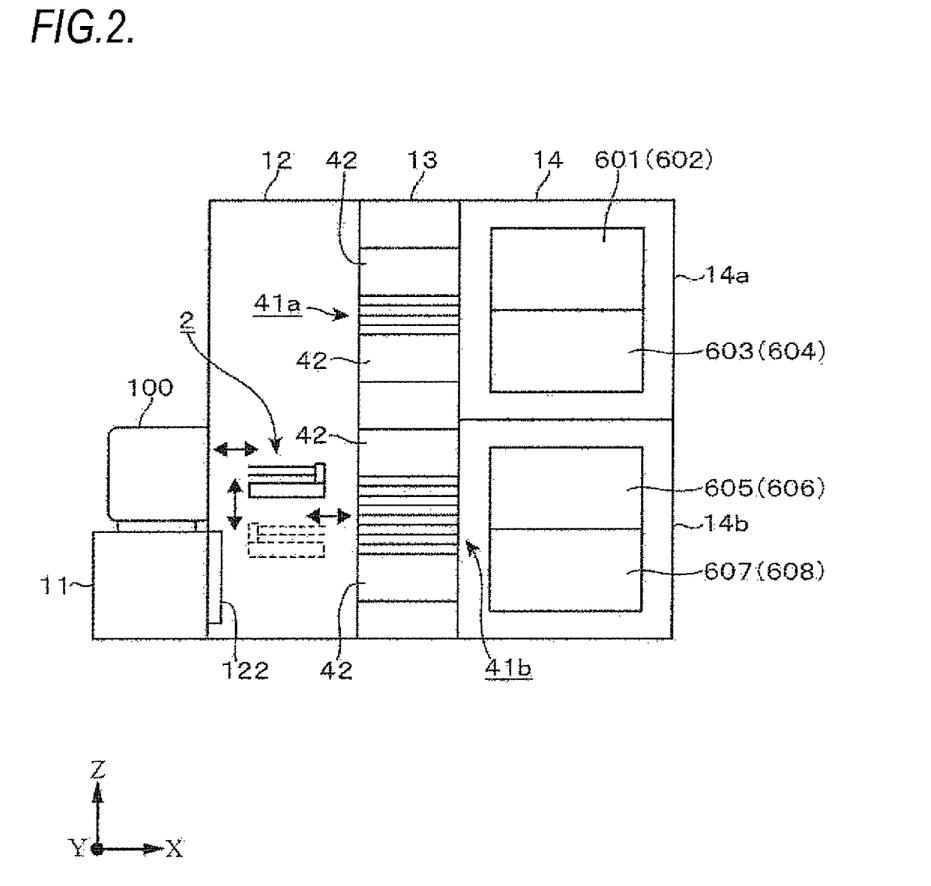
FIG. 2 is a vertical side view of the liquid processing apparatus.

FIG. 1 is a transverse plan view illustrating an entire configuration of the liquid processing apparatus 1 and FIG. 2 is a vertical side view thereof, and a description thereof will be made while taking the left sides of the drawings as front sides. In the liquid processing apparatus 1, an FOUP 100 forming a substrate receiving unit is disposed in a loader 111 installed in a disposition block 11, and a plurality of wafers W, for example, having a diameter of 300 mm, which are received in FOUP 100, are transferred to a processing block 14 (an upper processing block 14a and a lower processing block 14b) on a rear side through a conveying block 12 and an intermediate block 13. In processing block 14, both surfaces of wafer W are liquid-processed and then dried in liquid processing units 601 to 608, and processed wafer W is received in FOUP 100 again.

Conveying block 12 is configured such that an opening/closing door 122 for opening and closing a cover installed on a side surface of FOUP 100 and a conveying mechanism 2 for transferring wafer W between FOUP 100 and intermediate block 13, are installed in a case.

Figure 3:
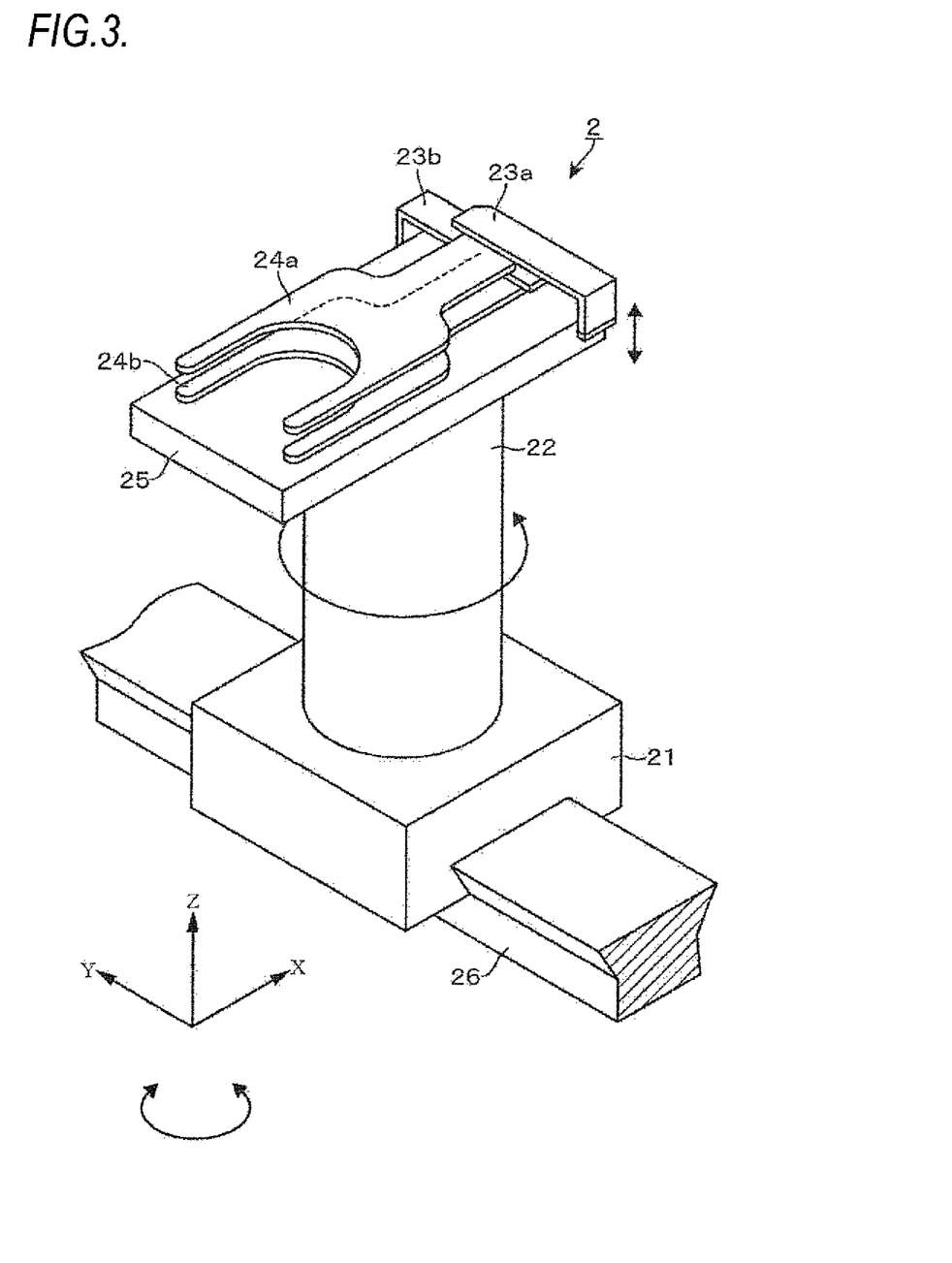
FIG. 3 is a perspective view of a conveying mechanism for a wafer which is installed in the liquid processing apparatus.

As illustrated in FIG. 3, the conveying mechanism 2 includes a traveling body 21 that travels on a rail 26 extending along an arrangement direction of FOUPs 100 disposed in loader 111, an elevating shaft 22 installed to extend upwardly from an upper surface of travelling body 21 and configured to be expanded/contracted and rotatable, and a base 25 installed at an upper end of elevating shaft 22 and to which two fork type wafer holding members 24a and 24b (substrate holding members) are attached through support members 23a and 23b.

Wafer holding members 24a and 24b are disposed on an upper surface side of base 25 so as to be stacked each other at an interval, and wafer holding members 24a and 24b may be moved forward and backward when viewed from base 25 using driving mechanisms (not illustrated) installed in base 25. Herein, the driving mechanisms are installed in wafer holding members 24a and 24b, respectively, and include, for example, a motor, a linear guide, and a belt. The driving mechanisms may move wafer holding members 24a and 24b independently or simultaneously. Each of wafer holding members 24a and 24b may hold wafers W one by one from a rear surface side of wafer W.

Intermediate block 13 is a space in the case formed between conveying block 12 and liquid processing blocks 14a and 14b along a forward and backward direction, and includes disposition shelves 41a and 41b which are intermediate conveying units where unprocessed wafer W drawn out from FOUP 100 and wafer W processed in liquid processing units 601 to 608 are disposed, a transfer mechanism 3 for transferring wafer W between disposition shelves 41a and 41b, and a reversing mechanism 42 for reversing wafer W to liquid-process opposite surfaces of wafer W.

Figure 4:
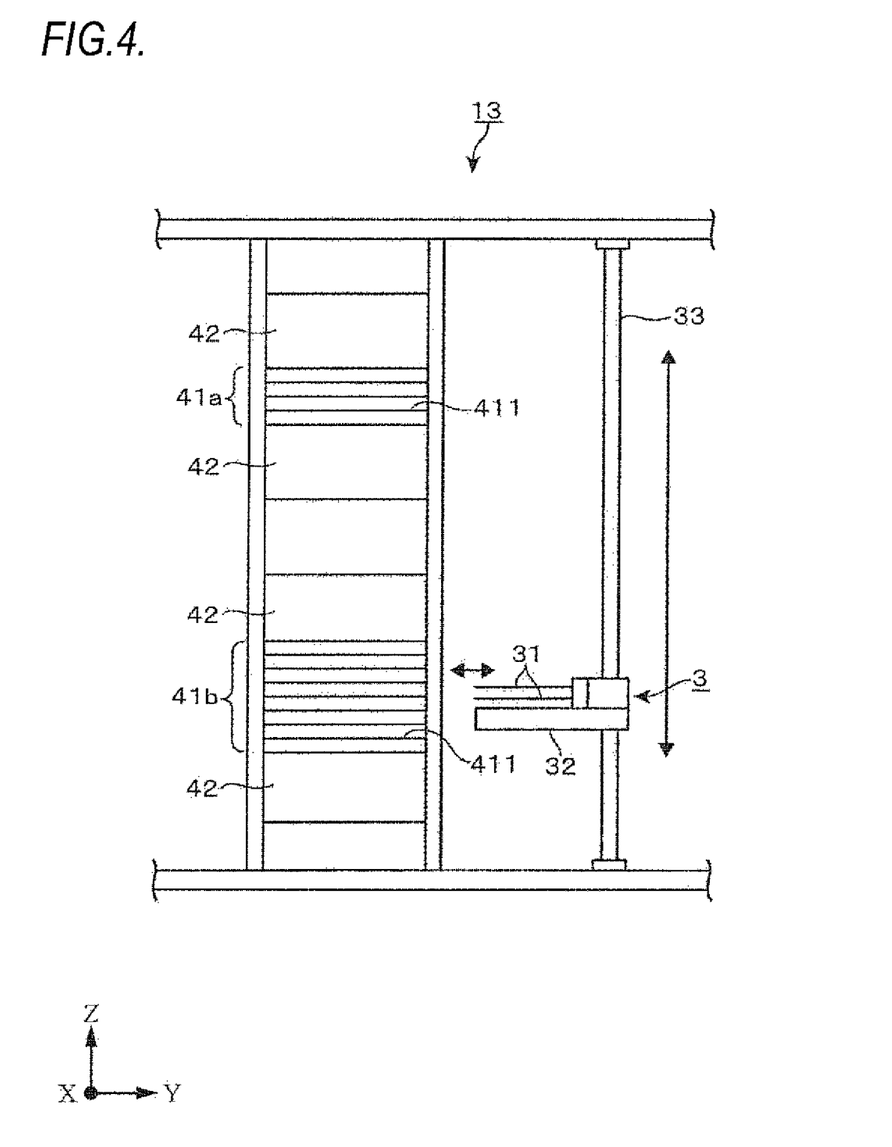
FIG. 4 is a side view of a wafer disposing shelf and a wafer transfer mechanism installed in the liquid processing apparatus.

As illustrated in FIG. 4, each of disposition shelves 41a and 41b is configured by a shelf stage where plate-shaped shelf plates 411 including, for example, three holding pins (not illustrated) are vertically disposed at an interval. In the present exemplary embodiment, four stages of shelf plates 411 are installed in disposition shelf 41a and eight stages of shelf plates 411 are installed in disposition shelf 41b. Herein, as will be described below, processing blocks 14a and 14b of the present exemplary embodiment are vertically stacked in two stages, and disposition shelves 41a and 41b are vertically disposed in parallel at heights corresponding to processing blocks 14a and 14b, respectively.

In detail, as illustrated in FIGS. 1, 2 and 4, disposition shelf 41a is disposed at a height where a transport mechanism 5 installed in upper processing block 14a (first processing block) can access to disposition shelf 41a. Disposition shelf 41b is disposed at a height where a transport mechanism 5 installed in lower processing block 14b (second processing block) and above-described conveying mechanism 2 can access to disposition shelf 41b. Disposition shelves 41a and 41b constitute the intermediate conveying unit of the present exemplary embodiment, and upper disposition shelf 41a corresponds to a first intermediate conveying unit and lower disposition shelf 41b corresponds to a second intermediate conveying unit.

Transfer mechanism 3 illustrated in FIGS. 1 and 4 transfers wafer W upwardly and downwardly between disposition shelves 41a and 41b disposed vertically. Transfer mechanism 3 includes a rail 33 extending vertically between a bottom surface and a ceiling surface of a case constituting intermediate block 13, a base 32 movable upward and downward along rail 33, and, for example, two wafer holding members 31 capable of moving forward and backward when viewed from base 32.

Here, as illustrated in FIG. 1, transfer mechanism 3 and transport mechanism 5 in upper processing block 14a may access to upper disposition shelf 41a from respective directions thereof, and mechanisms 3 and 5 may dispose or withdraw wafer W without interfering with each other. Likewise, conveying mechanism 2, transfer mechanism 3 and transport mechanism 5 in lower processing block 14b may access to lower disposition shelf 41b from respective directions thereof such that mechanisms 2, 3 and 5 may dispose or withdraw wafer W without interfering with each other.

As illustrated in FIG. 2, four reversing mechanisms 42 are installed on and under the disposition shelves 41a and 41b, respectively, so as to correspond to the heights of liquid processing units 601 to 604 disposed in upper processing block 14a to be stacked each other in two stages and liquid processing units 605 to 608 disposed in lower processing block 14b to be stacked each other in two stages. Each of reversing mechanisms 42 includes an arm-shaped wafer holding member (not illustrated) which is configured to hold a side circumferential surface of wafer W and to be rotatable about a horizontal shaft, and may be reversed by 180° between a state where a surface of wafer W faces upward and a state where a rear surface of wafer W faces upward.

As illustrated in FIGS. 1 and 2, upper processing block 14a including four liquid processing units 601 to 604 and lower processing block 14b including four liquid processing units 605 and 608 likewise are stacked vertically in processing block 14. Upper processing block 14a and lower processing block 14b have the same configuration, and thus only upper processing block 14a will be exemplified.

Transport mechanism 5 which is configured to access to disposition shelf 41a, reversing mechanisms 42 on the upper and lower sides of disposition shelf 41a and each of liquid processing units 601 to 604 is installed in upper processing block 14a. Transport mechanism 5 is capable of moving forward and backward and rotating about a vertical shaft, and includes a wafer holding member which is configured to be elevated and retreated. Transport mechanism 5 has similar configuration to conveying mechanism 2 illustrated in FIG. 3, but includes, for example, at least two wafers holding members and may withdraw a processed wafer W from liquid processing units 601 to 604 and then lay an unprocessed wafer W in corresponding processing units 601 to 604.

Liquid processing units 601 and 603 for performing a liquid processing on a surface of wafer W are disposed on the left side when viewed from the front side to be stacked each other in two vertical stages, and liquid processing units 602 and 604 for performing a liquid processing on a rear surface of wafer W are disposed on the right side to be stacked each other in two vertical stages, with a space through which transport mechanism 5 is moved forward and backward being therebetween.

A single type liquid processing unit 6 for performing a liquid processing on wafers W one by one through, for example, a spin processing, is installed in each of liquid processing units 601 to 604. As exemplified in the vertical side view of FIG. 5, liquid processing unit 6 holds wafer W substantially horizontally with a wafer holder 63 (substrate holder) disposed within an outer chamber 61, and rotates wafer holder 63 about a vertical shaft to rotate wafer W. A liquid processing is performed on an upper surface (a surface when the surface faces upward and a rear surface when the rear surface faces upward) of a wafer, by introducing a nozzle arm 64 to a space above rotating wafer W and supplying a processing liquid and a rinsing liquid from a nozzle unit 641 provided at a front end of nozzle arm 64 in a predetermined order.

Figure 5:
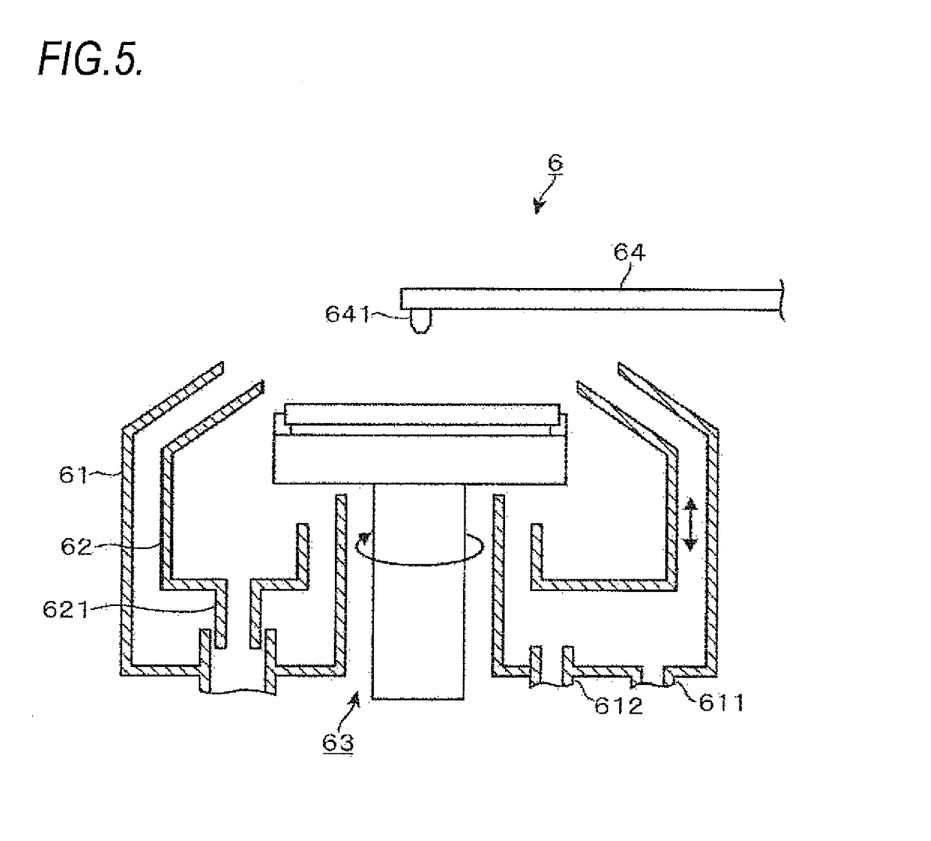
FIG. 5 is a vertical side view of a liquid processing unit installed in the liquid processing apparatus.

The liquid processing is performed, for example, in a following sequence: removal of particles or an organic contaminant using an SC1 solution (a mixture of ammonium hydroxide, hydrogen peroxide and deionized water (DIW)) which is an alkaline processing liquid, rinse cleaning using the DIW which is a rinsing liquid, removal of a native oxide layer using a hydrofluoric acid aqueous solution (hereinafter, referred to as diluted hydrofluoric acid (DHF)) which is an acidic processing liquid, and rinse cleaning using the DIW. In the liquid processing, physical cleaning using a brush or a liquid spray may be performed. The processing liquids or the rinsing liquid is received into outer chamber 61 or an inner cup 62 disposed within outer chamber 61 and is discharged from liquid discharge ports 611 and 621. The atmosphere within outer chamber 61 is exhausted through an exhaust port 612. After the liquid processing is completed, isopropyl alcohol (IPA) is supplied to an upper surface of wafer W while wafer W is rotated and IPA drying for shaking off IPA is performed.

The liquid processing using above-described liquid processing unit 6 is performed on a surface of wafer W in liquid processing units 601 and 603. After processed wafer W is carried out by transport mechanism 5 and reversed by reversing mechanism 42, wafer W is carried into liquid processing units 602 and 604 to perform the same liquid processing on a rear surface of wafer W.

Liquid processing units 605 to 608 installed in lower processing block 14b also include liquid processing unit 6 illustrated in FIG. 5, liquid processing units 605 and 607 being stacked on the right side of the space through which transport mechanism 5 is moved forward and backward may perform a processing on a surface of wafer W, and liquid processing units 606 and 608 being stacked on the left side of the space may perform a processing on a rear surface of wafer W.

Liquid processing apparatus 1 having the above-described configuration is connected to a control unit 7 as illustrated in FIG. 1. The control unit 7 includes a computer including a CPU and a storage, which are not illustrated, and a program where a group of steps (instructions) are written for control the operation of liquid processing apparatus 1, that is, sequentially withdrawing wafer W from FOUP 100, transferring wafer W to each of liquid processing units 601 to 608 through disposition shelves 41a and 41b, performing a liquid processing on wafers W using the plurality of liquid processing units 601 to 608 simultaneously, transferring wafer W in a path opposite to the carry-in path, and receiving wafer W in FOUP 100 is stored in the storage. The program is stored in a storage medium such as, for example, a hard disc, a compact disc, a magneto-optical disc, and a memory card, and is installed from the medium to the computer.

In particular, when processed wafer W is transferred from liquid processing units 601 to 604 to disposition shelf 41b and then transferred to FOUP 100 by conveying mechanism 2, control unit 7 of liquid processing apparatus 1 in the present exemplary embodiment has a function of determining which one of the following two cases should be executed: (1) a case of waiting until succeeding processed wafer W is transferred to disposition shelf 41b and transferring both wafers W together using two wafer holding members 24a and 24b, and (2) a case of not waiting succeeding processed wafer W but transferring only preceding wafer W.

As an example of a reference for performing the determination, when processed wafer W is disposed in disposition shelf 41b and then processed wafer W is not disposed in another shelf plate 411 of disposition shelf 41b, the control unit 7 of the present example compares a standby time until succeeding processed wafer W is disposed in disposition shelf 41b with a transport time after preceding processed wafer W is transferred to FOUP 100 and until next unprocessed wafer W withdrawn from FOUP 100 is disposed in disposition shelf 41b.

When the standby time is shorter than the transport time, control unit 7 determines that conveying mechanism 2 waits until succeeding processed wafer W is disposed in disposition shelf 41b and then transfers both wafers W together. Meanwhile, when the standby time is longer than the transport time, control unit 7 determines that conveying mechanism 2 does not wait for succeeding processed wafer W, but transfers only preceding processed wafer W to FOUP 100, and withdraws unprocessed wafer W from FOUP 100 and disposes in disposition shelf 41b.

Figure 6:
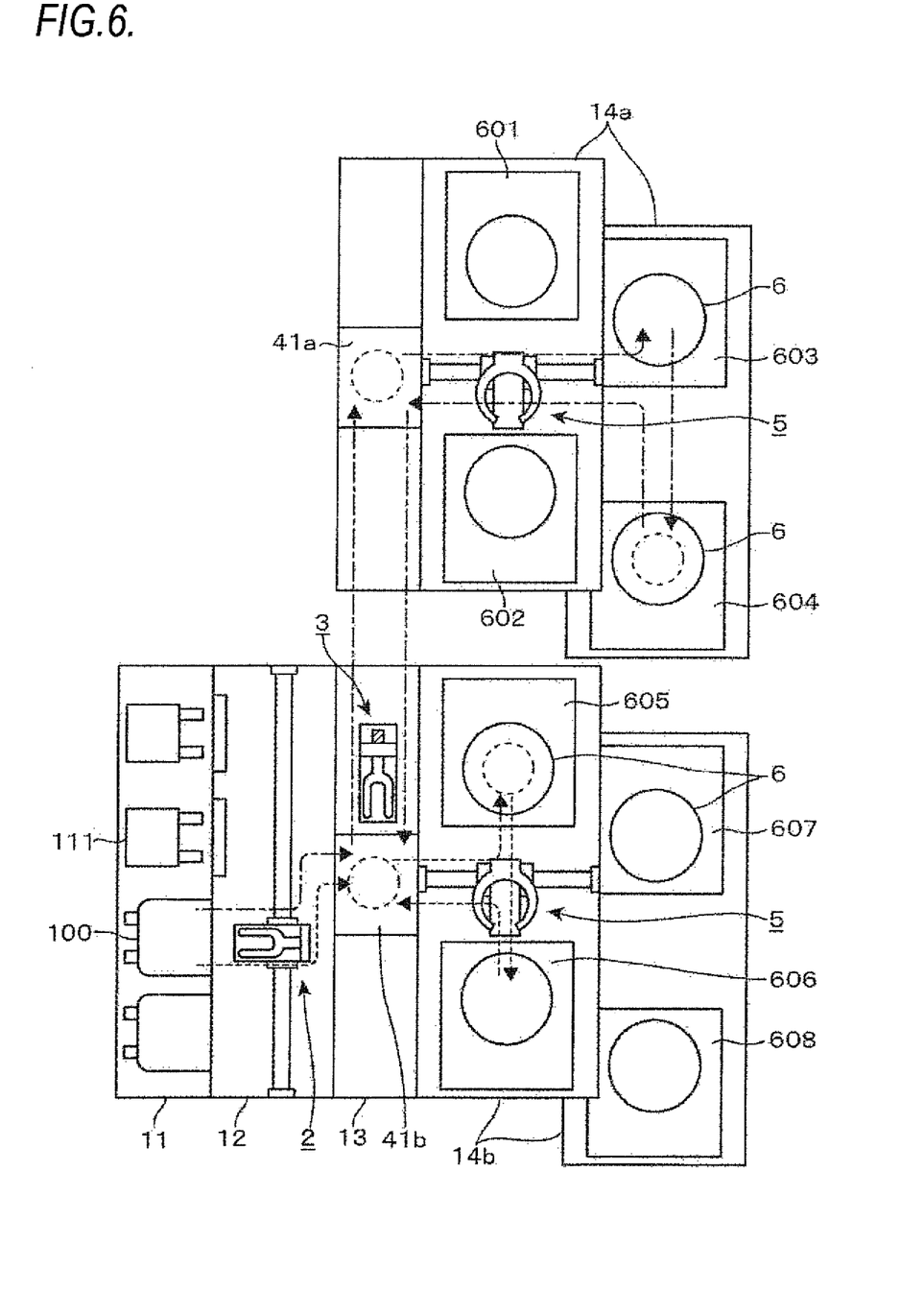
FIG. 6 is an explanatory view illustrating an operation of the liquid processing apparatus.

An operation of liquid processing apparatus 1 having the above-described configuration will be described with reference to FIGS. 6 and 7. If FOUP 100 is disposed on loader 111, FOUP 100 is connected to conveying block 12, and the cover is removed. Conveying mechanism 2 sequentially introduces wafer holding members 24a and 24b into FOUP 100, withdraws two unprocessed wafers W as a set, and disposes wafers W on shelf plate 411 at a preset stage of disposition shelf 41b (for example, shelf plates 411 at the lower four stages of the eight stages). FIG. 6 illustrates an example of a transport path of one wafer W of two wafers W as a set withdrawn from FOUP 100 with a broken line, and an example of a transport path of the other wafer W with a one-dot chain line.

When one wafer W of wafers W disposed in disposition shelf 41b is processed in lower processing block 14b, transport mechanism 5 in lower processing block 14b is introduced into disposition shelf 41b to withdraw wafer W and carry wafer W into liquid processing units 605 and 607 (liquid processing unit 605 in the example of FIG. 6) for performing a liquid processing on a surface of wafer W. Wafer W is held on wafer holder 63 of liquid processing unit 6, and various liquid processings and IPA drying are performed in the sequence described with reference to FIG. 5. Wafer W surface-processed in this way is withdrawn from liquid processing units 605 and 607, and is transferred to reversing mechanism 42 such that the surfaces of wafer W are reversed.

Wafer W with front and rear surfaces being reversed so that the rear surface faces upward is withdrawn from reversing mechanism 42 by transport mechanism 5, and is carried into liquid processing units 606 and 608 (liquid processing unit 606 in the example of FIG. 6) for performing a liquid processing on the rear surface of wafer W. In order to avoid making the drawing of FIG. 6 complicated, a transport path is omitted for transfer of wafer W between each of liquid processing units 605 to 608 and reversing mechanism 42.

Even in liquid processing units 606 and 608, wafer W is held on wafer holder 63 of liquid processing unit 6, and various liquid processing and IPA drying are performed in the sequence described with reference to FIG. 5. Wafer W whose rear surface has been liquid-processed is withdrawn from liquid processing units 606 and 608 by transport mechanism 5 and is transferred to reversing mechanism 42 to be reversed again.

Wafer W with both sides being liquid-processed and the front surface faces upward again is withdrawn from reversing mechanism 42 by transport mechanism 5 and disposed on shelf plate 411 (for example, shelf plate 411 at upper four stages of eight stages) at a preset stage of disposition shelf 41b.

In parallel with the processing of one wafer W transferred in the sequence illustrated by a broken line in FIG. 6 as described above, a case where the other wafer W is processed in upper processing block 14a will be described.

The other wafer W disposed in lower disposition shelf 41b is transferred to upper disposition shelf 41a by transfer mechanism 3, withdrawn by transport mechanism 5 in upper disposition block 14a, and is carried into liquid processing units 601 and 603 (liquid processing unit 603 in the example of FIG. 6) for performing a liquid processing on a surface of wafer W. Wafer W is held on wafer holder 63 of liquid processing unit 6, and after various liquid processing and IPA drying are performed on wafer W in the sequence described with reference to FIG. 5, wafer W is withdrawn from liquid processing units 601 and 603 by transport mechanism 5 and the opposite surfaces of wafer W are reversed by reversing mechanism 42.

Wafer W with front and rear surfaces being reversed so that the rear surface faces upward is carried into liquid processing units 602 and 604 (liquid processing unit 604 in the example of FIG. 6) for performing a liquid processing on the rear surface of wafer W by transport mechanism 5. Even in liquid processing units 602 and 604, wafer W is held on wafer holder 63 of liquid processing unit 6, and various liquid processing and IPA drying are performed in the sequence described with reference to FIG. 5. Wafer W with rear surface being liquid-processed is withdrawn from liquid processing units 602 and 604 by transport mechanism 5 and is reversed again by reversing mechanism 42.

Wafer W with both front and rear surfaces being liquid-processed and the front surface faces upward in this way is withdrawn from reversing mechanism 42 by reversing mechanism 5, and after disposed in shelf plate 411 of disposition shelf 41a, wafer W is transferred to shelf plate 411 (above-described shelf plates 411 at the upper four stages) at a preset stage of disposition shelf 41b by transfer mechanism 3.

After wafers W are processed in parallel in this way, processed wafers W are transferred from disposition shelf 41b to FOUP 100 using conveying mechanism 2. At this time, it is determined whether both wafers W will be transferred simultaneously after waiting that preceding processed wafer W and succeeding processed wafer W are provided in disposition shelf 41b, or only one processed wafer disposed in disposition shelf 41b first will be transferred. A flow of the determining operation will be described with reference to the flowchart of FIG. 7.

During the operation of liquid processing apparatus 1, conveying mechanism 2 repeatedly carries in unprocessed wafer W and carries out processed wafer W between FOUP 10 and disposition shelf 41b. At a time point (start) which conveying mechanism 2 starts to operate to withdraw processed wafer W from disposition shelf 41b, it is verified whether processed wafer W is present in disposition shelf 41b (step S101), and conveying mechanism 2 waits until processed wafer W is transferred to disposition shelf 41b if wafer W is not present (step S101; No). At this time, when shelf plate 411 for disposing unprocessed wafer W is unoccupied, a carry-in operation of wafer W may be performed during a standby time.

When wafer W (corresponding to a first substrate) processed first among wafers W withdrawn from FOUP 100 as a set is disposed in disposition shelf 41b (step S101; YES), a standby time until a succeeding wafer W is transferred is calculated (step S102).

Herein, several patterns may be considered as the 'succeeding wafer W'. (A) For example, there is a case where the other wafer W (corresponding to a second substrate) withdrawn from FOUP 100 as a set during a carry-in operation is a succeeding wafer W. When another wafer W which has been processed earlier than the other wafer W withdrawn as the set is present, (B) another wafer W carried into processing units 601 to 608 first may be the 'succeeding wafer W'. (C) Among wafers W processed by processing units 601 to 608, another wafer W processed first may be the 'succeeding wafer W'. In this way, a method of determining the 'succeeding wafer W' which is efficient in operating conveying mechanism 2 may be properly selected.

Meanwhile, for example, in the storage of control unit 7, a transport time counted after preceding processed wafer W disposed in disposition shelf 41b is transferred to FOUP 100 and until a next unprocessed wafer W withdrawn is disposed in disposition shelf 41b is stored in advance. A standby time calculated according to the processing situation of a succeeding wafer W and stored transport time are compared with each other (step S103), and when the standby time is shorter than the transport time (step S103; YES), the process waits until the succeeding processed wafer W is transferred to disposition shelf 41b (step S104).

After the succeeding processed wafer W is transferred to disposition shelf 41b (step S105), two wafers W are withdrawn and transferred to FOUP 100 (step S106). At this time, wafers W held in wafer holding members 24a and 24b may not be the same wafers W simultaneously withdrawn from FOUP 100. Each of wafers W is carried into the original stage of FOUP 100 where corresponding wafer W is received when carried out.

Thereafter, after two unprocessed wafers W are withdrawn from FOUP 100 as a set and are carried into disposition shelf 41b (step S107), and it is verified whether a processed wafer W which may be carried out next is present (step S101).

Meanwhile, when a standby time counted until the succeeding processed wafer W is transferred to disposition shelf 41b is longer than a transport time counted until conveying mechanism 2 transfers one wafer W to FOUP 100 and returns (step S103; NO), the process does not wait the succeeding wafer W and preceding processed wafer W is withdrawn from disposition shelf 41b to be transferred to FOUP 100 (step S108). Thereafter, after two unprocessed wafers W are withdrawn from FOUP 100 as a set and transferred to disposition shelf 41b, and it is verified whether a processed wafer W may be carried out from disposition shelf 41b (step S101).

In this way, conveying mechanism 2 of the present example in principle is configured to withdraw two wafers W from FOUP 100 as a set and transfer wafers W to disposition shelf 41b. However, for example, when only one unprocessed wafer W is accommodated in FOUP 100 or when only one shelf plate 411 where an unprocessed wafer W can be disposed is left in disposition shelf 41b, only one wafer W may be withdrawn from FOUP 100 to be transferred to disposition shelf 41b.

Accordingly, liquid processing apparatus 1 performs an operation of sequentially withdrawing wafers W from FOUP 100 disposed in disposition block 11 and returning wafers W to original FOUP 100 in a sequence where wafers W are processed. If all wafers W in FOUP 100 are processed, the above-described operation is repeated by exchanging FOUP 100 on loader 111 from which unprocessed wafer W is withdrawn.

Liquid processing apparatus 1 according to the exemplary embodiment of the present disclosure provides the following effects. In an operation of conveying mechanism 2 for transferring processed wafers W between disposition shelf 41b where a plurality of wafers W are disposed and FOUP 100, after wafer W is disposed in disposition shelf 41b, it is determined whether to wait until a succeeding processed wafer W is disposed in disposition shelf 41b and transfer both wafers W together, or to transfer preceding wafer W without waiting for the disposition of the succeeding processed wafer W. Accordingly, wafers W can be flexibly transferred using conveying mechanism 2 as compared with a case of necessarily waiting for the succeeding processed wafer W and transporting two wafers W together, making it possible to transfer wafers W more efficiently.

For example, there is a case where two or more types of wafers W having different processing times are received in one FOUP 100, or a case where FOUPs 100 receiving wafers W having different processing times are disposed side by side on disposition block 11. In this case, wafers W having different processing times are processed in parallel in liquid processing units 601 to 608. In this case, if the process waits until two processed wafers W are provided in disposition shelf 41b to be transferred to FOUP 100, the timings for completing the processing of wafers W may be discordant, causing an unnecessary standby time.

In this case, the unnecessary standby time described above can be reduced in the present disclosure since liquid processing apparatus 1 of the present example determines whether to wait for succeeding processed wafer W to transfer both wafers W together or to transfer only the preceding processed wafer W without waiting for the succeeding processed wafer W.

In particular, liquid processing apparatus 1 of the present example compares a standby time counted until the succeeding processed wafer W is transferred to disposition shelf 41b with a transport time counted after the preceding processed wafer W is transferred to FOUP 100 and until a next unprocessed wafer W withdrawn from FOUP 100 is disposed in disposition shelf 41b, and when the standby time is shorter than the transport time, the process waits until the two wafers W can be transferred together. Meanwhile, when the standby time is longer than the transfer time, the process does not wait for the succeeding wafer W but only preceding wafer W is transferred to FOUP 100, and therefore, an unnecessary standby time can be reduced, thereby realizing an efficient transfer.

For example, when wafers W are alternately transferred to vertically processing blocks 14a and 14b being stacked vertically to perform a processing, there is a case where wafer W carried into processing blocks 14a and 14b returns to disposition shelf 41b and conveying mechanism 2 transfers wafer W to FOUP 100. In this case, if one of processing blocks 14a and 14b causes a problem and the other processing block 14b and 14a is in normal state, and the process waits until wafers W processed in both processing blocks 14a and 14b return to disposition shelf 41b, the entire liquid processing apparatus 1 is stopped.

In this regard, since liquid processing apparatus 1 of the present example can flexibly change a set of processed wafers W to be transferred simultaneously, even when transport mechanisms 5 of processing blocks 14a and 14b or liquid processing units 601 to 608 cause a problem, wafer W can continue to be processed by using a normal unit.

Herein, the method of determining whether to wait for the succeeding processed wafer W when a preceding processed wafer W is present in disposition shelf 41b is not limited to the method of comparing a standby time (FIG. 7) counted until the succeeding processed wafer W is transferred with a transport time counted after transferring the preceding wafer W and until a next unprocessed wafer W returns.

Figure 8:
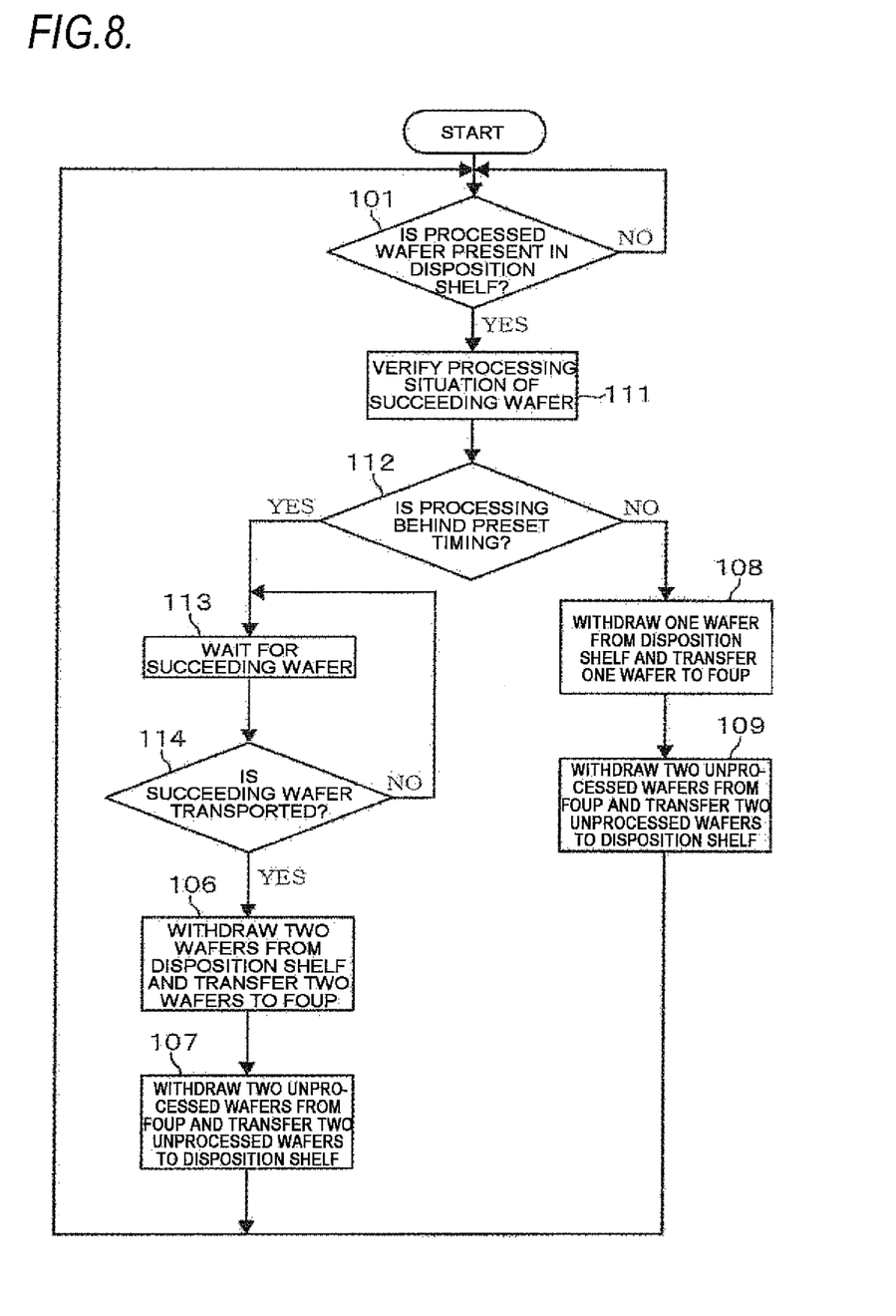
FIG. 8 is a flowchart illustrating an operational flow of a liquid processing apparatus according to another exemplary embodiment of the present disclosure.

For example, as illustrated in the flowchart of FIG. 8, when a processed wafer W is present in disposition shelf 41b (step S101; YES), a processing situation of succeeding wafer W is verified (step S111). When a processing after a preset timing is performed in the processing situation (step S112; YES), the process waits for a succeeding wafer W to transfer two wafers W (steps S113 and S114). When a processing before a preset timing is performed in the processing situation (step S112; NO), the process does not wait for a succeeding wafer W and one wafer may be transferred (step S108).

A detailed example will be described with reference to FIG. 6. Regarding the two wafers W withdrawn from FOUP 100 as a set, when a wafer W processed in lower processing block 14b is transferred to disposition shelf 41b and conveying mechanism 2 is able to transfer the wafer W from disposition shelf 41b, 'a preset timing' of above-described step S111 is set to be a start of an IPA drying on a rear surface of succeeding wafer W. At this time, when the IPA drying on wafer W is already started in liquid processing unit 604 of upper processing block 14a, the process waits until the IPA drying is completed and wafer W is transferred to disposition shelf 41b. Meanwhile, when a rinse cleaning is performed after DHF processing but before the IPA drying is started, conveying mechanism 2 does not wait until a succeeding wafer W is transferred, and transfers only one wafer W transferred to disposition shelf 41b. Even in the present example, 'a succeeding wafer W' is determined by the determining method of (A) to (C) described in the first exemplary embodiment.

Figure 7:
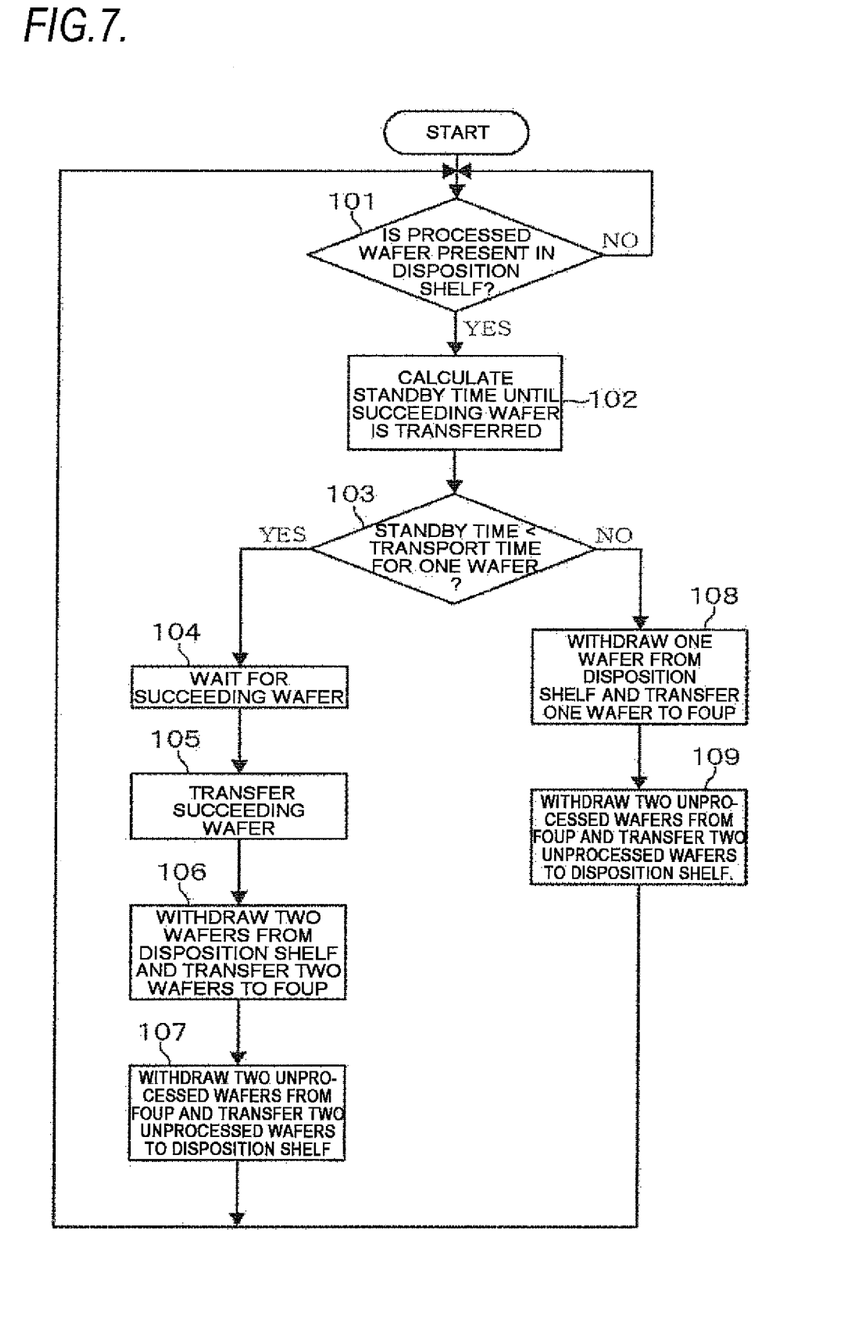
FIG. 7 is a flowchart illustrating an operational flow of the liquid processing apparatus.
Figure 9:
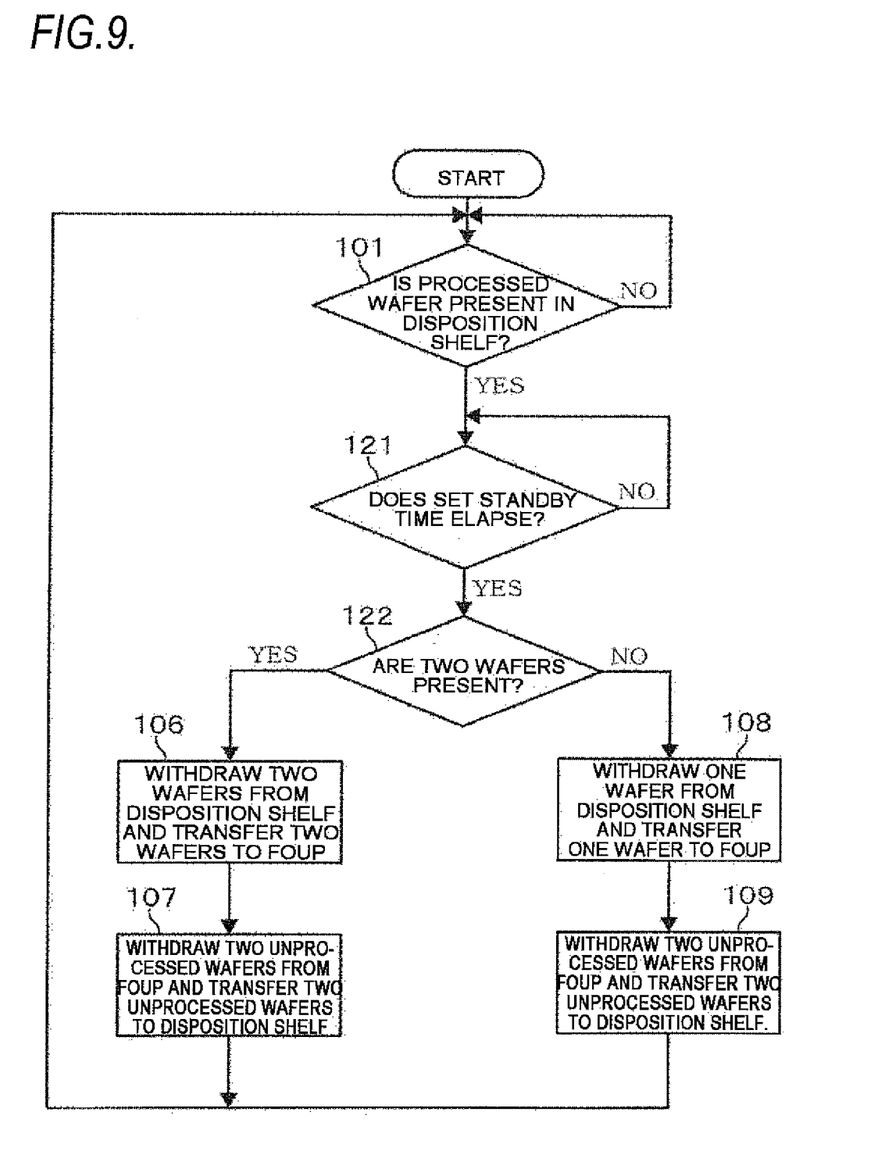
FIG. 9 is a flowchart illustrating an operational flow of a liquid processing apparatus according to yet another exemplary embodiment of the present disclosure.

The flowchart illustrated in FIG. 9 is different in that the determination whether one wafer W or two wafers W will be transferred is based on a time lapse of a timer rather than verifying a state of a succeeding wafer W such as a standby time counted until a wafer W is transferred or a processing situation as illustrated in FIGS. 7 and 8. Specifically, when a wafer W which can be carried out is present in disposition shelf 41b (step S101; YES), the timer installed in control unit 7 is operated and the process waits for a succeeding processed wafer W to be transferred until the preset standby time elapses (step S121; NO).

After the preset standby time elapses, when two processed wafers W are present in disposition shelf 41b (step S122; YES), the two wafers W are transferred (step S106). Meanwhile, when only one wafer W is present in disposition shelf 41b even after the preset standby time elapses (step S122; NO), the one wafer W is transferred without waiting for a succeeding wafer W (step S108). Even in this case, wafers W can be efficiently transferred as compared with a case where the process continuously waits for a succeeding wafer W indefinitely. When the two wafers can be transferred at step S101 as illustrated in FIG. 9, the operation of the timer (step S121) is omitted and two wafers W may be transferred immediately. When a succeeding processed wafer W is transferred during an operation of the timer, two wafers W may be transferred immediately at a time point when the succeeding processed wafer is transferred without waiting for the preset standby time to be elapsed.

Herein, the number of wafer holding members 24a and 24b installed in conveying mechanism 2 is not limited to an example of two, and three or more wafer holding members 24 may be installed. In this case, for wafers W which can be held by all wafer holding members 24 installed in conveying mechanism 2, it may be determined whether the process waits for a succeeding processed wafer W sequentially. In this case, among wafers W sequentially withdrawn from FOUP 100, one wafer W withdrawn may be taken as a first substrate, a wafer W continuously withdrawn after the one wafer W may be taken as a second substrate, and it can be considered that a plurality of sets may be formed in this way. For example, when three wafers W are withdrawn, a set is formed between first wafer W and second wafer W, and another set is also formed between second wafer W and a third wafer W.

Three or more wafers W withdrawn from FOUP 100 may be taken as a set. In this case, when conveying mechanism 2 is at a timing for starting an operation of withdrawing a processed wafer W from disposition shelf 41b, all wafers W (may be one or plural) which is disposed in disposition shelf 41b and can be held by wafer holding member 24 may be integrated to be treated as a preceding processed wafer W (first substrate). In this case, when an unoccupied wafer holding member 24 is left, it may be determined whether the process will wait for a succeeding wafer W for all wafer holding members 24 which are left, or for some wafer holding members 24 (for example, one wafer holding member 24). When the process does not wait for a succeeding wafer W and a preceding processed wafer W is transferred to FOUP 100, succeeding wafers W having returned to disposition shelf 41b afterward may be transferred together or one by one.

Processing block 14 is not limited to a case of being separated into upper processing block 14a and lower processing block 14b which are stacked, and for example, only one set of processing block 14 including a plurality of liquid processing units 600 may be installed, or a plurality of processing blocks 14 may be arranged to be adjacent in a horizontal direction such that transport mechanism 5 in processing block 14 may access to a common disposition shelf 41. When processing blocks 14 are not stacked, one disposition shelf 41 may be installed instead of vertically arranging disposition shelves 41a and 41b. In this case, transfer mechanism 3 may not be necessary.

Although it has been exemplified that a wafer W is processed in a liquid processing unit using a processing liquid in the above-described exemplary embodiments, the type of processing unit to which the present disclosure can be applied, is not limited thereto. The present disclosure may be applied to a substrate processing apparatus equipped with a conveying mechanism provided with a plurality of substrate holding units, and configured to transfer processed wafers W from various processing units for coating a resist film, developing, heating and cooling before and after the development, etching or depositing a wafer W to a substrate receiving unit through an intermediate conveying unit.

It is apparent that the type of the substrate processed by the substrate processing apparatus is not limited to a wafer W, but may be an angular glass substrate which is a material for a flat panel display (FPD).

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing apparatus comprising:
   a disposition table where a carrier configured to receive a plurality of substrates is disposed;
   a plurality of processing chambers each configured to process a substrate withdrawn from the carrier;
   a shelf configured to dispose the plurality of substrates temporarily between the disposition table and the plurality of processing chambers;
   a transport mechanism configured to transfer the substrates between each of the processing chambers and the shelf one by one;
   a conveying mechanism including a plurality of substrate holding arms and configured to transfer the substrates between the carrier and the shelf, the plurality of substrate holding arms being configured to move either independently or simultaneously; and
   a controller including a CPU and programmed with a non-transitory computer readable storage medium to control an overall operation of the substrate processing apparatus,
   wherein, among a plurality of substrates withdrawn from the carrier as a first set by the conveying mechanism, when a first substrate of the first set processed first in one of the plurality of processing chambers is transferred from the one of the plurality of processing chambers to the shelf by the transport mechanism, and then a second substrate of the first set processed successively to the first substrate of the first set in one of the plurality of processing chambers is transferred to the shelf by the transport mechanism, the controller is programmed to:

establish a predetermined transport time required by the conveying mechanism to transfer the first substrate of the first set from the shelf to the carrier and then to withdraw a first substrate and a second substrate of a second set from the carrier and dispose the first substrate and second substrate of the second set in the shelf;

after establishing the predetermined transport time, store the predetermined transport time in the non-transitory computer readable storage medium;

after storing the predetermined transport time, calculate a standby time that would elapse from when the first substrate of the first set arrives at the shelf from the one of the plurality of processing chambers after being processed until the second substrate of the first set finishes being processed and arrives at the shelf from one of the plurality of processing chambers, and compare the standby time with the predetermined transport time stored in the non-transitory computer readable storage medium, wherein if the controller determines that the standby time is shorter than the predetermined transport time, the controller waits for the second substrate of the first set to finish being processed and arrive at the shelf, and then transfers the first substrate of the first set and the second substrate of the first set processed successively to the first substrate of the first set in one of the plurality of processing chambers together from the shelf to the carrier by the conveying mechanism;

wherein if the controller determines that the standby time is longer than the transport time, the controller transfers the first substrate of the first set from the shelf to the carrier by the conveying mechanism without waiting for the second substrate of the first set processed successively to the first substrate to be transferred from one of the plurality of processing chambers to the shelf; and wherein the controller controls the plurality of substrate holding arms such that the plurality of substrate holding arms are moved either independently or simultaneously based on a determination as to whether the first substrate of the first set is transferred together with the second substrate of the first set processed successively to the first substrate of the first set or the first substrate of the first set is transferred first without waiting for the second substrate of the first set processed successively to the first substrate of the first set to be transferred from one of the plurality of processing chambers to the shelf.

2. The substrate processing apparatus of claim 1, wherein the processing chambers include a first group of upper processing chambers and a second group of lower processing chambers which are vertically stacked on each other, the shelf includes a first shelf communicated with the first group of processing chambers and a second shelf communicated with the second group of processing chambers, and the conveying mechanism is configured to transfer a substrate between the first shelf and the second shelf, and transfer a substrate between the second shelf and the carrier.

3. The substrate processing apparatus of claim 1, wherein each of the processing chambers is a single-type liquid processing chamber configured to perform a liquid processing on the plurality of substrates one by one and includes a substrate holder which is rotatable and configured to hold a substrate horizontally, and a nozzle unit configured to supply a processing liquid to a rotating substrate.

4. The substrate processing apparatus of claim 1, wherein the controller is programmed such that after the first substrate of the first set is transferred from the shelf to the carrier by the conveying mechanism, the controller controls the conveying mechanism to withdraw two unprocessed substrates from the carrier and transfer the two unprocessed substrates to the shelf.

* * * * *